United States Patent [19]  
Ernsberger

[11] 4,286,052  
[45] Aug. 25, 1981

[54] METHOD FOR MAKING STAINED GLASS PHOTOMASKS USING STABILIZED GLASS

[75] Inventor: Fred M. Ernsberger, Pittsburgh, Pa.

[73] Assignee: PPG Industries, Inc., Pittsburgh, Pa.

[21] Appl. No.: 110,952

[22] Filed: Jan. 10, 1980

[51] Int. Cl.³ .......................... B05D 3/14; B05D 3/02
[52] U.S. Cl. ................................... 430/330; 427/12; 427/287; 427/314; 427/380; 427/399
[58] Field of Search .................. 427/287, 314, 12, 38, 427/380, 399; 430/321, 320, 330, 331

[56] References Cited

U.S. PATENT DOCUMENTS

| 2,927,042 | 3/1960 | Hall et al. ............................ 430/330 |
| 3,561,963 | 2/1971 | Kiba ................................... 430/330 |
| 3,573,948 | 4/1971 | Tarnopol ............................. 430/330 |
| 3,620,795 | 11/1971 | Kiba ................................... 430/330 |
| 3,732,792 | 5/1973 | Tarnopol ............................. 430/330 |
| 4,144,066 | 3/1979 | Ernsberger .......................... 427/12 |
| 4,192,666 | 3/1980 | Lupoi .................................. 427/287 |
| 4,197,105 | 4/1980 | Hummel et al. ..................... 427/287 |

OTHER PUBLICATIONS

Kingery et al., "Introduction to Ceramics", 2nd Ed., 1960, pp. 599–603.
Scholes, "Modern Glass Practice", 7th Ed., 1975, pp. 384 and 385.
Shand, "Glass Engineering Handbook", 2nd Ed., 1958, pp. 11 and 12.
Tool, "Relation Between Inelastic Deformability and Thermal Expansion of Glass in its Annealing Range", J. Am. Cer. Soc., vol. 29, No. 9, 1946, pp. 240–253.

*Primary Examiner*—Ronald H. Smith
*Assistant Examiner*—Janyce A. Bell
*Attorney, Agent, or Firm*—Dennis G. Millman

[57] ABSTRACT

Accuracy of producing stained glass photomasks is improved by means of a preliminary heat treatment to adjust the fictive temperature of the glass, thereby improving dimensional stability during subsequent production of a stained pattern in the glass.

10 Claims, 6 Drawing Figures

METHOD FOR MAKING STAINED GLASS PHOTOMASKS USING STABILIZED GLASS

BACKGROUND OF THE INVENTION

Photomasks are used in the art of photolithography for producing printed circuits and other precision photo-fabricated parts. In a photolithographic process a substrate is covered with a layer of photoresist in which a pattern is photographically developed by superimposing over the photoresist a photomask having patterned transparent and opaque areas and then passing actinic radiation, usually ultraviolet light, through the transparent areas of the photomasks. A pattern is then developed in the photoresist as a relief image by means of differential solubilities of the exposed and unexposed portions. Etching or other treatments may then be carried out on the underlying exposed portions of the substrate. A general discussion of the state of the art of photo-fabrication and the role played by photomasks may be found in *Scientific American*, September 1977, pages 111–128.

Photomasks have typically consisted of films of photographic emulsion, iron oxide, or chromium on glass plates. However, since a photomask is essentially a production tool which must be used repetitively it has been desired to increase the durability of photomasks by creating the desired opaque and transparent areas as stained images within the glass plates rather than coatings on the surfaces of glass plates. Several techniques for producing stained images within glass plates are known, such as those disclosed in U.S. Pat. Nos. 3,573,948 (Tarnopol); 3,732,792 (Tarnopol et al.); 3,561,963 (Kiba); 2,927,042 (Hall et al.); 3,620,795 (Kiba); 4,144,066 (Ernsberger); and 4,155,735 (Ernsberger) and in pending U.S. patent applications Ser. No. 60,422 filed July 25, 1979 and Ser. No. 80,875 filed on Oct. 1, 1979, both by Fred M. Ernsberger.

The present invention relates to an improvement in any of these techniques or any other technique for producing stained patterns within glass plates or sheets wherein one of the essential steps entails heating the glass to a relatively high temperature. Developing a stain within the glass generally requires subjecting the glass to a temperature above 300° C. and sometimes as high as 500° C. or above. It has been found that at these elevated temperatures the glass substrate undergoes permanent dimensional changes which cause the dimensions of the stained pattern to deviate from those intended. Because the patterns carried by photomasks must be precisely predetermined even a small degree of such dimensional inaccuracy may be unacceptable. With standard soda-lime-silica flat glass employing a heat treatment which may range as high as about 525° C., shrinkage of the glass is encountered. The rate of shrinkage is slower at lower temperatures and may be insignificant at temperatures around 300° C. for reasonably short heat treatment times. However, it is generally preferred to maximize the temperature so as to shorten the length of a heat treatment step. Also, the production of more durable, deeply penetrated stains is sometimes associated with heat treatment at higher temperatures. Thus, avoiding dimensional instabilities appeared to be at odds with other desirable factors in the production of stained glass photomasks.

It has been possible to photographically compensate for the dimensional instabilities of the glass when photographically transferring the image to the glass, but such a procedure is not very satisfactory in most cases due to loss of resolution in the resulting image. Compensation for dimensional changes could also be made in the original design layout, but it would be difficult to predict the precise amount of change which would be encountered and such a procedure would be cumbersome to carry out.

SUMMARY OF THE INVENTION

It has now been found that dimensional instability of a glass substrate used in making a stained glass photomask can be substantially alleviated by means of a particular heat treatment preceding the image producing process steps. The purpose of this preliminary heat treatment is to modify the "fictive" temperature of the glass to more closely correspond to the temperature of the subsequent stain producing heat treatment. Fictive temperature represents an equilibrium state in the density of the glass, and therefore modifying the fictive temperature of a glass substrate so as to bring it close to the temperature at which it is desired to carry out the staining process results in dimensional stability of the glass during staining.

In the most common case, it will be found unsuitable to carry out a staining process at the fictive temperature of commercially available flat glass since the fictive temperature is sufficiently high to present a danger of distorting the glass sheet through softening. Carrying out the staining at a lower temperature, however, results in shrinkage. Therefore, in that case, the practice of the present invention entails lowering the fictive temperature of the glass into the range where staining may be carried out without distorting the glass. The converse situation might arise if the glass substrate has been thoroughly annealed so that the fictive temperature is below the temperature at which it is desired to carry out the staining process. In that case, raising the fictive temperature to the vicinity of the staining process alleviates expansion of the glass which would have occurred without modifying the fictive temperature.

THE DRAWINGS

FIG. 1 shows a glass substrate which has been heat treated in accordance with the present invention and has subsequently had a layer of photosensitive material applied to a surface.

FIG. 2 depicts an exposure step wherein the photosensitive layer is exposed to a pattern of radiation.

FIG. 3 shows the second exposure step in an etch-bleach reversal development process which may be optionally employed.

FIG. 4 depicts the glass substrate with the developed image thereon.

FIG. 5 shows the electromigration of silver ions from the developed image into the surface of the glass.

FIG. 6 represents the heating step in which coloration is developed in the migrated staining ions within the glass.

DETAILED DESCRIPTION

Figure 1:
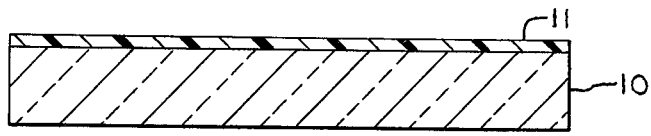
FIGS. 1–6 are cross-sectional views through a glass sheet and various layers applied thereto, schematically illustrating the sequence of steps in a preferred method for making stained glass photomasks which may be employed in conjunction with the present invention.

"Fictive temperature" is a term used by glass scientists to describe a state of physical equilibrium in a piece of glass. If maintained at a given temperature for a sufficient length of time the atomic constituents of a glass network will arrange themselves into a stable internal structural arrangement which is unique to that particular temperature. This "packing" arrangement directly affects the density of the glass and influences other physical properties of the glass. Once the equilibrium structural arrangement and the accompanying physical properties are established, cooling the glass sheet relatively rapidly to a temperature where significant structural rearrangement is unlikely does not alter the physical properties of the glass. Thus, every piece of glass exhibits physical properties which are partly determined by the particular temperature at which its equilibrium structural arrangement was established, or at which it appears to have been established. The forming and annealing of commercial flat glass seldom provide enough time at any one temperature for true equilibrium to be attained, but the average structure "frozen" into a piece of glass exhibits properties which correspond to the properties that would have been attained if the glass had reached equilibrium at a particular single temperature. This apparent equilibrium temperature has been given the name "fictive temperature" by glass scientists. Theoretically, reheating a piece of glass to its fictive temperature results in no permanent change in the physical properties regardless of the length of time at the fictive temperature. But heating the glass for any substantial length of time at a temperature at which appreciable structural rearrangement can occur, other than the fictive temperature, induces structural rearrangement which causes a shift in the fictive temperature and alters the physical properties.

A succinct definition of fictive temperature is set forth in "Introduction to Ceramics," W. D. Kingery et al., 2nd Ed., 1975 (Wiley, New York), at page 600 as follows: "that temperature at which the glass structure would be in equilibrium if brought infinitely rapidly to that temperature." This definition, together with the explanation of the preceding paragraph, may be taken as the definition of the term "fictive temperature" as used herein.

Additional information regarding fictive temperature of glass may be found in "Glass Engineering Handbook," E. B. Shand, 2nd Ed., 1958 (McGraw-Hill, New York), pages 11 and 12; in "Modern Glass Practice," S. R. Scholes, 7th Ed., 1974 (Cahners Books, Boston), pages 384 and 385; and in J. Am. Ceram. Soc., 29, 240 (1946).

It is the densification and resulting shrinkage of glass at elevated temperatures below its fictive temperature which is the major concern of the present invention. This is because the fictive temperature of standard, commercial, annealed, soda-lime-silica flat glass produced by the float process is typically about 580° C., which is a temperature unsuitably high for carrying out staining processes due to the risk of softening and distorting the glass at such a temperature. Therefore, it is preferred to carry out staining techniques at elevated temperatures below the fictive temperature of commercial flat glass, but it is believed that this practice incurs densification of the glass and, thus, the observed shrinkage. The linear shrinkage encountered when producing stained glass photomasks at relatively high temperatures is typically on the order of about 0.02 to 0.03 percent.

In the present invention the problem of shrinkage is alleviated by subjecting the glass to a preliminary heat treatment so as to render the fictive temperature of the glass approximately the same as the temperature intended to be employed for staining the glass. The simplest way to establish a new fictive temperature is to maintain the glass at the desired fictive temperature for a sufficient time for structural equilibrium to be reached. However, the structural rearrangement takes place initially rapidly but the rate tapers off to approach equilibrium asymptotically, which may entail an undue length of time for practical applications. Therefore, to lower the fictive temperature more rapidly, it is preferred to employ a heat treatment slightly below the target fictive temperature and to stop the heat treatment when the density of the glass is approximately equal to the density corresponding to the desired fictive temperature. For example, when lowering the fictive temperature from 580° C. to 500° C. a treatment temperature of 475° C. for two hours has been found to be sufficient for a sheet of soda-lime-silica float glass measuring 14 inches by 17 inches by 0.190 inch. The plate thus pretreated, when subsequently subjected to a 15 minute exposure at 500° C., showed no significant permanent dimensional change. This "overshoot" temperature should not be excessively below the target fictive temperature since the initial rate of structural rearrangement decreases with decreasing temperature and the advantage of increased speed may be lost at unduly low temperatures.

Although one is much more likely to encounter fictive temperatures which are too high rather than too low, the invention is equally applicable to raising the fictive temperature of a glass substrate whose fictive temperature is lower than the temperature of a step in the staining process. In such a case, the object of the invention would be a reduction in the irreversible part of the expansion of the glass which would occur during staining. The upward adjustment of the fictive temperature is carried out in the same manner as described above by means of a preliminary heat treatment at or near the desired fictive temperature. And, similarly, the equilibrium density conditions may be arrived at more rapidly by overshooting the desired fictive temperature, in this case to a slightly higher temperature.

This invention is applicable to any technique for imparting a patterned, stained image to a glass substrate, such as those set forth in the "Background of the Invention" above. It is particularly useful, however, in connection with a preferred type of patterned staining process in which staining ions are electromigrated into the glass from a photographically developed layer applied to the glass. The best mode known for carrying out this type of staining process is that disclosed in U.S. application Ser. No. 80,875 filed on Oct. 1, 1979, by Fred M. Ernsberger, and the disclosure of that application is hereby incorporated by reference. In this type of staining process, the migration of the staining ion into the glass advantageously takes place at a relatively low temperature, and then coloration is developed by reducing and agglomerating the migrated ions at a somewhat higher temperature. It is usually only this second, higher temperature step in which dimensional instability is encountered to an appreciable degree. Thus, the pretreatment to adjust the fictive temperature will usually be adapted to bring the fictive temperature of the glass close to the temperature of the coloration step. With regard to other types of staining processes, it may be stated in general that the fictive temperature should be brought into approximate correspondence with the highest process temperature employed in the staining process. The appropriate time for carrying out the preliminary heat treatment to adjust the fictive temperature may vary from process to process, but in general it may be stated that it should be effected prior to transferring the desired pattern to the glass. In the preferred types of processes for generating patterned stains in glass which employ a photosensitive layer applied onto the glass, the preliminary heat treatment should be carried out prior to the application of the photosensitive layer onto the glass. In other words, the sheet of glass 10 shown in FIG. 1 has already been subjected to the preliminary heat treatment before deposition of the photosensitive layer 11.

The following is a description of a preferred embodiment for imparting stained patterns to a glass substrate by means of the electromigration technique.

The substrates upon which the photomasks of the preferred embodiment are based are transparent sheets of glass. Composition of the glass is not critical so long as it contains mobile cations capable of being electromigrated at moderate voltages to provide sites into which silver stain-producing ions may be injected. Alkali metal ions such as sodium, potassium, and lithium have relatively high mobility in glass, and, thus, glasses having at least minor amounts of alkali metal oxides are particularly useful. For example, conventional soda-lime-silica flat glass compositions typically include about 10 to 13 percent by weight sodium oxide and often a trace of potassium oxide, which represents a more than ample supply of mobile cations. Borosilicate glass compositions having much lower alkali metal oxide concentrations have been used for coated photomask substrates and may be used, provided that the stain intensity produced is adequate to suit the particular needs of the photomask user. Also suitable are commercially available glass compositions formulated for enhanced ion exchange properties, and which are characterized by a substantial amount of aluminum oxide and/or zirconium oxide.

Photographic emulsions useful in the preferred embodiment are those which are capable of being developed to produce a residual layer of emulsion and silver or silver halide which has sufficient electrical conductivity to permit electromigration of silver ions from the film into a glass substrate. The emulsion should also have high resolving power in order to maximize the degree of resolution of the photomask produced. A class of photographic emulsions found to be suitable for use in the present invention are the high contrast orthochromatic emulsions used by the graphic arts, preferred examples of which include "Kodak Ortho Plate PFO" and "Kodak Precision Line Plate LPP." Also feasible for use in the invention are "Kodak Projector Slide Plates" and "Kodak Electron Image Plates." All of these products are sold by Eastman Kodak Company, Rochester, N.Y. These products are supplied by the manufacturer in the form of glass plates coated with the emulsion, and the glass plates may conveniently serve as the substrate for making the stained glass photomasks in the preferred embodiment.

Exposure and development of the photographic emulsions are carried out in accordance with standard photographic techniques, the precise details of which depend upon the particular product being used and are provided by the manufacturers of photographic emulsions. Basically, photographic emulsions comprise a gelatin carrier in which a silver halide is dispersed. Areas of a layer of a photographic emulsion, when exposed to light, form a latent image, and when subsequently developed by immersion in the appropriate developing solutions, the silver halide in the exposed areas is converted to colloidal silver. From this point the process may proceed as the development of a positive image or a negative image depending upon the type of emulsion and developing process being used. To form a negative image, the unexposed areas of the emulsion are dissolved, leaving the colloidal silver on the substrate in the exposed areas. To produce a positive image either an "etch-bleach reversal" process or a "non-etch reversal" process may be used. In either case, the developed colloidal silver is bleached out chemically and the entire plate is re-exposed and subjected to a second development process to convert the silver halide to colloidal silver in the unexposed areas. In the etch-bleach reversal process, the gelatin as well as the silver is removed from the exposed areas, whereas in the non-etch reversal process, a coating of gelatin remains on the entire surface of the substrate. When using either reversal process with the present invention it has been found unnecessary to carry out the second development to produce the colloidal form of silver since it has been found satisfactory to electromigrate silver ions into the glass from the silver halide form in the emulsion layer. The previously mentioned "Kodak Ortho Plate PFO" is adapted for making negative or positive images and the "Kodak Precision Line Plate LPP" is primarily intended for making negatives, although a reversal process may be used.

The preferred embodiment employs an electric field to migrate silver ions from the photographic emulsion into the adjacent glass surface, and, accordingly, the photographic emulsion must be provided with sufficient electroconductivity after developing to enable an electric charge to pass through the emulsion to permit the electromigration of silver ions to take place at a practical rate. Electrical conductivity is influenced by the original silver content of the emulsion and, therefore, the emulsions used for the present invention should be selected to have a relatively high silver content. The nature of the gelatin content of the emulsion and the degree to which the gelatin is dissolved during development also influence the electrical conductivity of the developed emulsion layer. In other words, after the emulsion has been developed, the silver or silver halide particles should be in sufficient proximity to one another so as to provide a path for electric current through the emulsion at reasonable voltages.

A practical voltage for the electromigration step is one which is at least high enough to migrate the desired quantity of silver ions within a reasonable period of time, but not so high as to arc around the edges of the glass substrate between the anode and cathode electrode layers or to cause localized perforation of electric current through the glass substrate which would defeat uniform migration of the ions into the glass. Voltages in the range of about 50 volts to 1000 volts are considered suitable but a voltage of about 2000 volts may be considered excessive.

Another factor affecting the conductivity of the emulsion is the thickness of the emulsion. Conductivity of the emulsion layer decreases with increased layer thickness and, therefore, the emulsion thickness should be minimized so long as sufficient silver per unit area is provided to permit forming a stain of the color density required. However, even the thinnest emulsion layers on commercially available photographic plates and films of the type discussed heretofore contain a more than ample supply of silver per unit area for producing even the darkest stains. For example, a developed emulsion layer about 9 micrometers thick and containing about 36 percent by weight metallic silver has been found to produce satisfactory results, but a layer of that same emulsion only two micrometers thick, for example, would still contain a surplus of silver for producing the staining effect. The practical limiting factor on the emulsion thickness is the ability to produce very thin, pin-hole free coatings of uniform thickness. Some commercially available photographic plates and films include an undercoat and/or overcoat of a non-silver containing layer of gelatin or other material which may decrease the conductivity of the composite and should thus be avoided. However, the "Kodak Electron Image Plate" referred to above, which includes a gelatin overcoat, has been found suitable for imparting a stain to a glass substrate.

The following table illustrates the general magnitude of silver concentration in the coatings of several examples of commercial photographic plates found suitable for use with the preferred embodiment. A relatively high concentration of silver per unit area is desirable, but it has been found that the concentration of silver in the gelatin may be an even more important parameter. Conductivity of the gelatin may also be an influential factor.

TABLE I

| | Ag (mg/cm$^2$) | Gelatin (mg/cm$^2$) | Ag/Gelatin |
|---|---|---|---|
| "Kodak Projector Slide Plate" | 0.65 | 1.76 | 0.37 |
| "Kodak Electron Image Plate" | 0.88 | 3.21 | 0.27 |
| "Kodak Ortho Plate PFO" | 0.56 | 0.49 | 1.13 |

It has been estimated that at least about 0.1 milligram of silver per square centimeter is required to be migrated into the glass to produce a reasonably dark stain. Thus, all of the above examples theoretically include a great surplus of silver. However, the effective amount of available silver can be affected by the distribution of the silver in the gelatin. Also, silver migrated into the glass is useful for producing the stained image only if it is at a depth which is accessible to the reducing agent employed in the reducing and agglomerating step.

A better understanding of the details of the preferred staining process may be had from the sequence of process steps illustrated in the drawings. In FIG. 1, a glass substrate 10 is shown with a layer 11 of photographic emulsion on the top surface thereof. Such a coated glass substrate may comprise a commercially prepared photographic plate, or the layer 11 may be applied by the user. In either case, the glass substrate 10 will have had its fictive temperature adjusted in accordance with the present invention prior to receiving layer 11.

Figure 2:
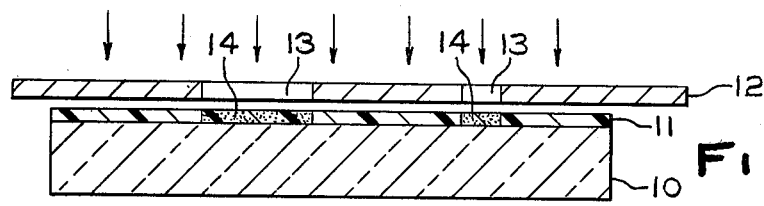

In FIG. 2, a master mask 12 having a pattern of apertures 13 therethrough is superimposed over the layer 11 of photographic emulsion and actinic radiation is passed through the apertures to expose areas 14 in the photographic emulsion. The master mask is shown schematically as an apertured plate, but it should be understood that it is conventional in the art for a master mask to consist of a developed photographic emulsion layer on the surface of a film or glass plate. The master mask preferably contacts the photographic emulsion layer 11, but in other photographic techniques it may be spaced therefrom.

Figure 3:
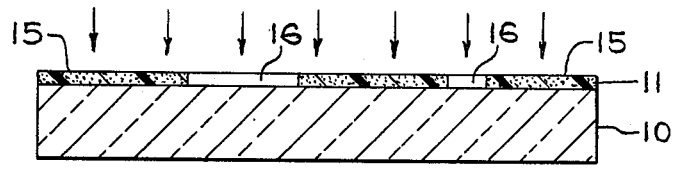
Figure 4:
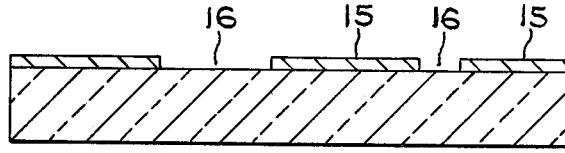

The exposed photographic emulsion may be developed by any of the various development techniques to fix the latent image created in areas 14. In FIG. 3, there is depicted an intermediate step in an etch-bleach reversal development process wherein, by immersing the substrate 10 and the emulsion layer 11 carried thereon into the appropriate developing solutions, the exposed areas 14 have had their silver content bleached out and gelatin dissolved. The remaining portions 15 of the emulsion may have part of their gelatin removed as well in the development process. It has been found that the patterned emulsion layer at this stage of the process is suitable for electromigration even though the silver in the remaining portions 15 of the emulsion are still in the silver halide form. However, if desired, the etch-bleach reversal process may be carried to completion by subjecting the emulsion to a second exposure as shown in FIG. 3 and immersing the substrate and the emulsion into a second development bath, whereby the silver halide is converted to colloidal metallic silver particles as shown in FIG. 4.

Figure 5:
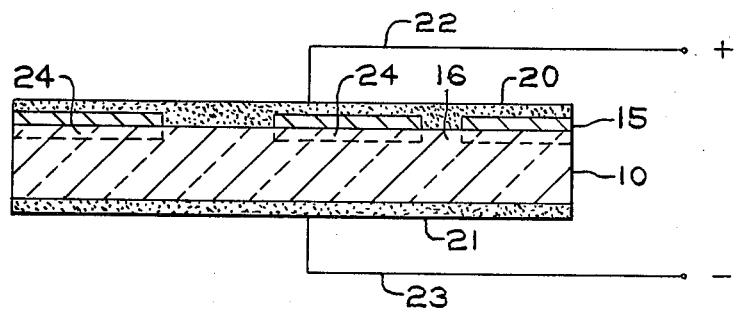

In FIG. 5, electrically conductive electrode layers 20 and 21 have been applied to the opposite surfaces of the glass substrate. Because it is easy to apply and remove, colloidal graphite is the preferred material for the electrode layers 20 and 21. The colloidal graphite layers may be applied to the substrate in slurry form, in which the colloidal graphite is suspended in an aqueous or alcohol vehicle, or the layers may be applied by means of commercially available aerosol sprays of colloidal graphite. Whatever material is used for the electrode layers 20 and 21, it must be applied sufficiently thick to render its resistance insignificant relative to the resistance of the glass (e.g., less than about 10 percent). The electrode layer 20 which overlies the developed photographic emulsion is connected by way of lead 22 to the anode side of a source of electrical potential, and the opposite electrode layer 21 is connected by way of lead 23 to the cathode side of the source of electrical potential.

Imposing a direct current electric field between the electrode layers 20 and 21 as shown in FIG. 5 causes a migration of mobile cations, especially alkali metal ions, out of the surface portion of the glass substrate on the anode side of the substrate. These mobile cations are repelled by the anode and are thus driven deeper into the glass substrate. At the same time, the electric field causes the stain-producing silver ions from the patterned photographic emulsion layer 15 to be injected into the glass in the patterned zones 24 lying directly below the photographic emulsion, where they take the places vacated by the migrated alkali metal ions. It is hypothesized that in the portions of the glass surface underlying the aperture areas 16 protons dissociated from water molecules diffusing through the electrode layer 20 are injected into the glass to take the place of the migrated alkali metal ions. It is believed that the porosity of the colloidal graphite material preferred as the electrode material enables this proton injection to take place.

The rate of ion migration is influenced by temperature and the applied voltage. At room temperature and a potential of only a few volts, the rate of ion migration would be virtually imperceptible. Therefore, elevated temperatures, preferably above 100° C., and a potential of at least about fifty volts are preferred in order to obtain reasonable treatment times. Although photographic emulsions are subject to melting and decomposition at elevated temperatures, it has been found that the use of a moderately elevated temperature in combination with an electric field permits a satisfactory electromigration to be carried out without harming the integrity of the photographic emulsion layer. Thus, the temperature during the electromigration process is maintained above about 100° C. but below the temperature at which the photographic emulsion begins to melt or decompose, which is typically around 300° C., depending upon the particular emulsion being used. As an example, temperatures in the range of about 200° C. to about 250° C. together with a potential of about 300 volts to 700 volts have been found to yield satisfactory results. Temperature and voltage are further interdependent because the conductivity of glass increases with increasing temperature, therby lessening the voltage requirement. Thus, by selecting an appropriate combination of temperature and voltage, a practical rate of ion migration can be attained without requiring the use of deleteriously high temperatures or excessive voltages.

Figure 6:
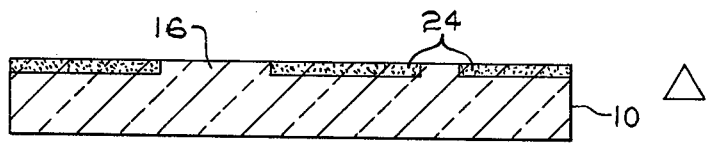

After the silver ions have been electromigrated into the glass to the desired depth, all layers may be removed from the glass substrate leaving nothing but a latent image within the glass substrate in the areas 24. As depicted in FIG. 6, development of coloration in the ion migrated zones 24 requires the application of heat in the presence of a reducing agent to first reduce the silver ions to their elemental state and then to agglomerate the silver ions into a submicroscopic crystalline form. The reducing agent may be present as a constituent of the glass, such as cuprous ions migrated into the glass or the stannous ions inherently present near a surface of glass produced by the float process, or as a reducing atmosphere such as a hydrogen-containing gas (forming gas) in the heating chamber during the reducing and agglomerating heat treatment. Use of the above-mentioned metallic ions as the reducing agent has the advantage of not requiring a controlled atmosphere, and thus can be carried out in air. The amber colored stain thus produced is generally located relatively far below the surface of the glass, thereby enhancing the durability of the photomask. On the other hand, reduction in forming gas produces an olive-green stain marked by relatively high absorptivity. It has also been found that the use of a reducing gas atmosphere permits the use of lower temperatures during the reducing and agglomerating steps, which leads to less spreading of the staining ions into the unstained areas of the pattern, thereby yielding improved resolution of the stained pattern.

The period of the reducing and agglomerating step is a function of temperature. At a temperature as low as 200° C., the reduction and agglomeration may theoretically be able to proceed, but are barely perceptible. Above about 400° C., the process usually proceeds measurably, but the treatment time may still be longer than preferred for a commercial operation. On the other hand, approaching temperatures at which deformation of the glass sheet may occur (e.g., above about 525° C. for the float glass used in the commercial products set forth above) should be avoided. An optimized rate may be achieved at about 475° C. to 525° C., at which temperatures a treatment time on the order of about 15 minutes can yield satisfactory stain coloration. However, when using forming gas as the reductant, it has been found that practical rates can be attained at lower temperatures, e.g., 350° C.–400° C. The lower temperatures are a distinct advantage for the sake of minimizing lateral spread of the staining ions, and thus maximizing resolution of the stained pattern. Treatment times with forming gas on the order of one hour are preferred to produce a fully developed stain at the lower temperatures, at which tin ions as the reducing agent would require many hours to yield a comparable stain density.

The reducing effects of forming gas and an internal ion such as tin have been found to be complementary. Thus, both may be used in combination to produce stained patterns having enhanced optical density (ultraviolet absorbance).

The tin-contacted surface of ordinary float glass may commonly be found to contain an average of about 0.5 to 1.3 percent by weight tin (expressed as tin oxide, related to approximately the first five microns), which may be adequate as a reducing agent for purposes of this embodiment. Selected float glass having 1.3 to 2.0 percent by weight tin ($SnO_2$) at the surface is preferred, however. Even higher tin contents, which may require special treatment of the glass, produce even better results, since higher tin concentrations permit shallower migration of silver, which reduces the potential for lateral spreading during heat treatment.

When the reducing and agglomerating step is carried out below about 400° C. with float glass having a fictive temperature of about 580° C., shrinkage is usually slow enough to avoid causing a significant problem, but the preliminary fictive temperature adjustment of the present invention may offer some desirable improvement nevertheless. But when reducing and agglomerating are carried out above 400° C., the fictive temperature adjustment becomes increasingly important. These temperature range considerations relate only to standard, commercial, flat glass, but should be pertinent to any staining method.

Due to the unidirectional influence of the electric field during the migration step, the stained zones 24 have been found to have very distinct boundaries, the sides extending nearly perpendicularly from the top surface of the glass. Also, the depth to which the stained zones extend into the glass appears to be quite uniform and distinct. The depth to which the stain extends into the glass is a function of the charge per unit area passed through the glass during the electromigration step. For a standard soda-lime-silica float glass, this depth can be calculated to be approximately one micron for each 0.1003 coulomb per square centimeter. The quantity of silver migrated into the glass is not strictly proportional to the charge passed per unit area. As electrolysis proceeds, depletion of the supply of silver in immediate contact with the glass surface can lead to the transport of other species, for example $H^+$ ions, into the glass, or $OH^-$ ions out of the glass.

The penetration depth desired for the silver ions will depend upon the particular requirement of a given application, in particular, the intensity of the stain desired. A depth of about one micron, for example, may be sufficient in many cases to render the stained zones sufficiently absorptive of ultraviolet radiation in contrast to the unstained areas. A depth of about 2 microns or more is preferred. The stained areas of the photomask can readily be provided with a transmittance of less than one percent in the violet-ultraviolet range of wavelengths (3,500 to 4,500 Angstroms) most commonly used in photolithographic processes. At the same time, the stained areas remain sufficiently transparent in the visible wavelength spectrum (e.g., about 10 percent or more) to aid an operator in aligning the photomask with a substrate to be printed. The unstained areas of the photomask, of course, retain the radiation transmittance properties of the base glass from which it is made, which might typically be at least an order of magnitude more transparent than the stained areas in the ultraviolet range.

The following two examples are presented to illustrate specific examples of carrying out the preferred staining process.

Example 1.

A "Kodak Precision Line Plate LPP" was exposed and developed by the etch-bleach reversal process in accordance with the procedure recommended by the manufacturer. The plate was based on a float glass substrate 12 inches by 16 inches by 0.13 inches (30.5 cm. by 40.6 cm. by 3.3 mm.), and the emulsion was coated on the tin contact surface of the glass. Both surfaces of the plate were sprayed with a suspension of colloidal graphite in isopropyl alcohol ("Aerodag G," Acheson Colloids Company, Port Huron, Mich.). The edges of the plate were wiped with a cloth dampened in ethanol to eliminate any overspray of graphite which might cause an electrical short between the upper and lower graphite coatings. The coated plate was supported horizontally in an oven with forced air circulation, and the graphite layer overlying the patterned emulsion was connected to the anode terminal of an adjustable d.c. power supply, and the opposite graphite layer was connected to the cathode terminal of the power supply. The temperature of the oven was raised to 210° C. Then a potential of 330 volts was applied which produced a current of 49 milliamperes. This current was maintained by periodic adjustment of the voltage until, after 60 minutes, the voltage reached the 380 volt limit of the power supply. Electromigration was continued with gradually decreasing current for a further 55 minutes at the end of which the current was 23.4 milliamperes. The integrated current dose was calculated to be approximately 72.9 milliampere hours. The plate was removed from the oven, cooled, and the coatings removed with hot water and detergent. At this point, the latent image in the glass was slightly perceptible because of the altered refractive index of the regions into which silver ions had been electromigrated. The plate was then placed on a sheet of heat resistant material and both were conveyed on a roller conveyor into a furnace operating at 900° F. (481° C.). The temperature of the glass in the furnace was monitored, and in 11 minutes the glass temperature reached 900° F. (481° C.), after which the glass was held a further 13 minutes at this temperature, then rapidly conveyed out of the furnace. The glass plate then possessed a patterned stain of amber color corresponding to the areas previously occupied by the developed photographic emulsion. The stained areas of the glass were found to have the following spectral transmission properties:

| Wavelength (Nanometers) | Transmission (Percent) |
| --- | --- |
| 550 | 46 |
| 525 | 32 |
| 500 | 17 |
| 475 | 4.7 |

-continued

| Wavelength (Nanometers) | Transmission (Percent) |
| --- | --- |
| 450 | 0.8 |
| 425 | 0.1 |

EXAMPLE 2

This example employed a sheet of float glass, four inches by nine inches by 0.190 inches (10.2 cm. by 22.9 cm. by 4.8 mm.), the tin contact surface of which was coated with a layer of photographic emulsion, which comprised the commercial product "Kodak Ortho Plate PFO." A master mask consisting of a developed photographic film carrying a printed circuit pattern was held in contact with the photographic emulsion on the glass plate by means of vacuum and the emulsion was exposed through the master mask to a diffused source of white light for 80 seconds. The exposed plate was fully developed in Kodak "Kodalith" developer. This developer solution is characterized by hydroquinone as the developing agent and a low concentration of sulphite. The action of the developer was stopped in the conventional manner by a short immersion of the plate in a dilute solution of acetic acid and then fixed conventionally with hyposulphite, washed thoroughly in water, and dried in air. The result was a negative image of the original pattern. Both sides of the plate were coated with colloidal graphite as described in Example 1 and connected to a source of d.c. potential within an oven as described in Example 1. The temperature of the oven was raised to 240° C. and 480 volts was applied, producing a current of 19.7 milliamperes. The voltage was continuously adjusted by an automatic control so as to maintain the current constant. At 40 minutes, the maximum voltage of the supply (700 volts) was reached and thereafter the current declined slowly, reaching 12.1 milliamperes at 65 minutes when electrolysis was discontinued. The plate was cooled immediately, and the coatings removed with hot water and detergent. The plate was then placed in a wire frame and placed in a box furnace at 500° C. in a nearly vertical position for 20 minutes. Upon removal from the furnace, it was covered with an insulating blanket to control cooling and avoid fracture. The glass plate then carried a patterned stain that was a negative reproduction of the original pattern on the film. Optical properties of the stained areas were essentially the same as those in Example 1.

Other modifications and variations as are known to those of skill in the art may be resorted to without departing from the spirit and scope of the invention as set forth by the appended claims.

I claim:

1. In a method of producing a precise stained pattern in a sheet of glass wherein a source of stained-producing ions is applied to a surface of a transparent sheet of glass having an established fictive temperature, stain-producing ions are migrated from said source into patterned areas of the glass sheet, and the glass sheet is then heated to a staining temperature range at which the migrated ions develop coloration within the glass sheet and at which the glass sheet remains essentially uncrystallized, and during said heating step a difference between the established fictive temperature of the glass sheet and the staining temperature range leads to undesirable dimensional changes in the glass sheet, the improvement comprising: prior to the application of the source of stain-producing ions onto the glass sheet, reducing the difference between the fictive temperature of the glass sheet and the staining temperature range by subjecting the glass sheet to a preliminary heat treatment at a temperature at which the fictive temperature of the glass sheet is substantially changed in the direction of the staining temperature range and essentially no crystallization of the glass sheet occurs, whereby dimensional stability of the glass sheet during the subsequent color development heat treatment step is improved.

2. The method of claim 1 wherein the range of staining temperatures is from 200° C. to 525° C.

3. The method of claim 1 wherein the range of staining temperatures is from 400° C. to 525° C.

4. The method of claim 2 or 3 wherein the initial fictive temperature of the glass sheet is above the range of staining temperatures.

5. The method of claim 1 wherein the preliminary heat treatment brings the fictive temperature to a first temperature by heating at a second temperature slightly beyond the first temperature.

6. The method of claim 4 wherein the preliminary heat treatment lowers the fictive temperature to a final temperature by heating the glass at a temperature slightly lower than said final temperature.

7. The method of claim 1 wherein the determination of the patterned areas of the glass into which stain producing ions are migrated is effected by a developed photosensitive layer carried on the glass sheet.

8. The method of claim 7 wherein the migration of stain-producing ions into the glass is aided by a direct current electric field.

9. The method of claim 7 wherein said photosensitive layer is a photographic emulsion coating containing silver ions.

10. The method of claim 1 wherein the stain-producing ions are selected from the group consisting of silver, copper, gold, and thallium.

* * * * *